US012586309B2

(12) United States Patent
Wang et al.

(10) Patent No.: US 12,586,309 B2
(45) Date of Patent: Mar. 24, 2026

(54) MACHINE-LEARNING METHOD ON VECTORIZED THREE-DIMENSIONAL MODEL AND LEARNING SYSTEM THEREOF

(71) Applicant: Vizuro TAIWAN COMPANY LTD., Taipei (TW)

(72) Inventors: Ting-Yuan Wang, Zhubei (TW); Wei-Chin Liu, Taoyuan (TW)

(73) Assignee: Vizuro TAIWAN COMPANY LTD., Taipei City (TW)

( * ) Notice: Subject to any disclaimer, the term of this patent is extended or adjusted under 35 U.S.C. 154(b) by 145 days.

(21) Appl. No.: 18/423,346

(22) Filed: Jan. 26, 2024

(65) Prior Publication Data

US 2024/0257451 A1    Aug. 1, 2024

Related U.S. Application Data

(60) Provisional application No. 63/442,470, filed on Feb. 1, 2023.

(51) Int. Cl.
*G06T 17/00* (2006.01)
*G06F 30/20* (2020.01)
(Continued)

(52) U.S. Cl.
CPC .............. *G06T 17/00* (2013.01); *G06F 30/20* (2020.01); *G06T 11/60* (2013.01); *G06V 10/764* (2022.01); *G06V 2201/07* (2022.01)

(58) Field of Classification Search
CPC .. G06V 10/764; G06V 2201/07; G06T 17/00; G06T 11/60; G06T 11/00; G06F 30/20; G06N 3/00
See application file for complete search history.

(56) References Cited

U.S. PATENT DOCUMENTS

| | | |
|---|---|---|
| 2021/0400247 A1 | 12/2021 | Casas |
| 2022/0101419 A1* | 3/2022 | Luo .......................... G06T 17/00 |
| 2022/0237410 A1* | 7/2022 | Wrenninge ............ G06V 20/56 |

FOREIGN PATENT DOCUMENTS

| | | | |
|---|---|---|---|
| CN | 109086798 A | 12/2018 | |
| CN | 111932673 B | * 12/2020 | ............... G06T 7/12 |

(Continued)

OTHER PUBLICATIONS

Sun et al., "Articulated Part-based Model for Joint Object Detection and Pose Estimation", Jan. 12, 2012, IEEE Xplore, https://doi.org/10.1109/ICCV.2011.6126309 (Year: 2012).*

*Primary Examiner* — Kee M Tung
*Assistant Examiner* — Thang Gia Huynh
(74) *Attorney, Agent, or Firm* — HDLS IPR SERVICES; Chun-Ming Shih

(57) ABSTRACT

A machine learning method on vectorized three-dimensional models and a learning system thereof are provided. The learning system uses a computer system to perform the machine learning method using synthetic images rendered from vectorized three-dimensional models. In the method, the system acquires a computerized engineering design drawing or a stereoscopic scan file of a target object. The engineering design drawing or a stereoscopic scan file is then converted into a specific file that can be processed to render synthetic images by a rendering program. A great amount of diversified synthetic images forms a training and testing dataset for an ensemble of machine learning algorithms to train an artificial intelligence model and evaluate its accuracy.

9 Claims, 4 Drawing Sheets

(51) Int. Cl.
　　 *G06T 11/60* 　　　(2006.01)
　　 *G06V 10/764* 　　(2022.01)

(56) 　　　　　　　References Cited

FOREIGN PATENT DOCUMENTS

| | | | |
|---|---|---|---|
| CN | 115409949 A | 11/2022 |
| TW | 202139079 A | 10/2021 |

\* cited by examiner

| | |
|---|---|
| Obtaining vectorized three-dimensional models of target objects | S201 |
| Converting vectorized three-dimensional models to a specific file format | S203 |
| Rendering plural and diversified synthetic images of target objects | S205 |
| Building training and testing datasets from synthetic images, enriched by image augmentation | S207 |

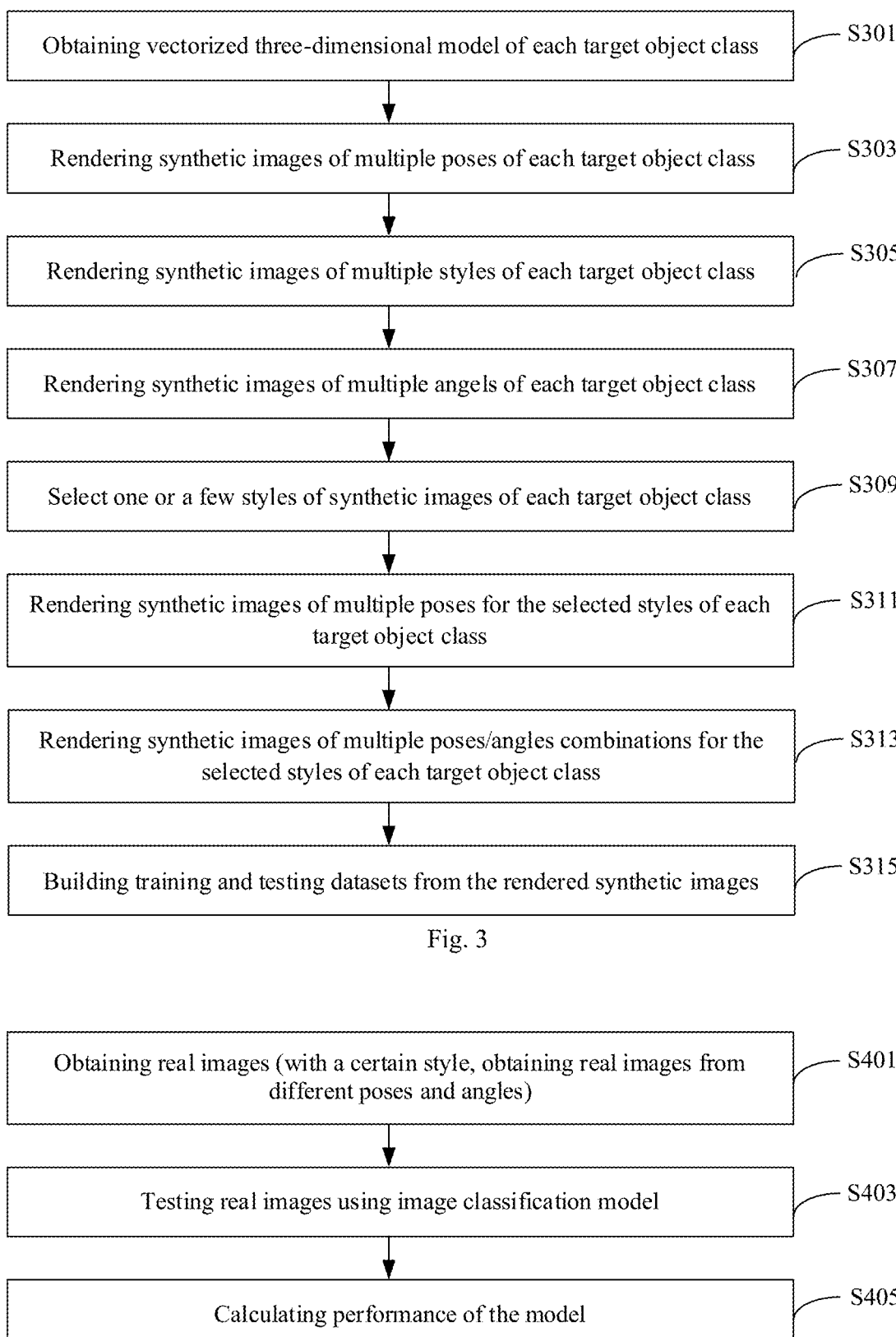

| Obtaining vectorized three-dimensional model of each target object class | S301 |

| Rendering synthetic images of multiple poses of each target object class | S303 |

| Rendering synthetic images of multiple styles of each target object class | S305 |

| Rendering synthetic images of multiple angels of each target object class | S307 |

| Select one or a few styles of synthetic images of each target object class | S309 |

| Rendering synthetic images of multiple poses for the selected styles of each target object class | S311 |

| Rendering synthetic images of multiple poses/angles combinations for the selected styles of each target object class | S313 |

| Building training and testing datasets from the rendered synthetic images | S315 |

Fig. 3

| Obtaining real images (with a certain style, obtaining real images from different poses and angles) | S401 |

| Testing real images using image classification model | S403 |

| Calculating performance of the model | S405 |

Fig. 4

MACHINE-LEARNING METHOD ON VECTORIZED THREE-DIMENSIONAL MODEL AND LEARNING SYSTEM THEREOF

FIELD OF THE INVENTION

The disclosure proposes an artificial intelligence method, particularly machine learning methods and learning systems for real-world object recognition using their vectorized three-dimensional (3D) models.

BACKGROUND OF THE INVENTION

Traditional object recognition artificial intelligence (artificial intelligence) focuses on three primary tasks: image classification, object detection, and image segmentation. These tasks typically require vast datasets for model training. For instance, large visual databases like ImageNet contain approximately 15 million images categorized into over 1,000 classes, with each class averaging over 10,000 images. Utilizing complex deep learning networks with numerous parameters, contemporary models can achieve accuracy exceeding 90% on general image classification tasks.

ImageNet's vast open-source images excel at training models for general image classification. This empowers, for example, self-driving cars where extensive training with such images enables robust environmental recognition during operation.

On the other hand, such general datasets often fall short for model training in highly specialized domains. For example, accurately detecting manufacturing defects within images of workpieces often requires transfer learning—a machine learning technique that leverages models trained on different but related domains. However, even transfer learning typically necessitates a significant amount of additional training data tailored to the specific use case. Furthermore, tasks like object detection and image segmentation generally require extensive manual labeling of training images, involving either bounding box annotations or detailed mask annotations, which can be a highly time-consuming and laborious process. This highlights the significant challenges associated with training image-related artificial intelligence models for specialized applications.

SUMMARY OF THE INVENTION

To address the challenges and limitations of requiring plural and diversified images to train artificial intelligence models specifically, object recognition model in practice, this disclosure proposes a novel machine learning method and learning system on vectorized three-dimensional models to generate synthetic, two-dimensional (2D) images by rendering, so as to amass the required volume and variety to train accurate artificial intelligence models.

In general, one innovative aspect of the subject matter described in the present disclosure can be embodied in a learning system, comprising: a computer system, wherein including a database, which stores the training set of plural and diversified synthetic images, and a processor, which is used to execute the machine learning method on vectorized three-dimensional models, wherein the machine learning method comprising: the vectorized three-dimensional model of a target object is acquired; converting the vectorized three-dimensional model to a specific file format that can be used for rendering and using a rendering program to render plural and diversified synthetic images; as well as more plural and diversified synthetic images are generated by image augmentation and a training and testing dataset are formed.

In certain examples, the computer system is composed of: image capture unit that acquires the vectorized three-dimensional model of a target object; image rendering unit that generate a large volume of the synthetic images of various states—combinations of styles, poses and/or angles—through the vectorized three-dimensional model of the target object; machine learning unit that to learn from plural and diversified synthetic images with different styles, postures, and/or angles from the training dataset to build an object recognition model under variations of real-world settings; test unit that tests and validates the performance of the object recognition model against testing datasets or real-world target objects.

In various examples, the vectorized three-dimensional model includes engineering design drawings obtained from computer-aided design (CAD) software, or stereoscopic scan files from stereoscopic scans of target objects from optical devices.

In some implementations, the vectorized three-dimensional model is constructed by a computer system with an automated program controlling a camera, to capture images of components of the target object at various distances, poses, and/or angles.

In some implementations, while obtaining the vectorized three-dimensional model of a target object, different environmental light sources are introduced to model the surface materials of each component of the target object, in order to render and produce synthetic images with different styles.

In some implementations, after capturing images of components of the target object at various distances, poses, and angles, one or a few of multiple styles—combinations of diverse environmental lighting conditions and surface materials—are selected.

In some implementations, a large volume of the synthetic images of various states—combinations of styles, poses and/or angles—are rendered and augmented, and the synthetic images are divided into training and testing datasets with a proportion.

In some implementations, an ensemble of machine learning algorithms is used to learn plural and diversified synthetic images with different styles, postures, and/or angles from the training dataset to build an object recognition model.

In some implementations, the types of the object recognition model include at least one of: image classification, object detection, and image segmentation.

In some implementations, the object recognition model is used to process the testing dataset or the real images of the target object in order to evaluate the object recognition accuracy.

The details of one or more embodiments of the subject matter described in this specification are set forth in the accompanying drawings and the description below. Other features, aspects, and advantages of the subject matter will become apparent from the description, the drawings, and the claims.

The foregoing Summary, including the description of some embodiments, motivations therefor, and/or advantages thereof, is intended to assist the reader in understanding the present disclosure, and does not in any way limit the scope of any of the claims.

BRIEF DESCRIPTION OF THE DRAWINGS

FIG. 3 shows the flowchart of an embodiment example of generating a training and a testing dataset using the vectorized three-dimensional model.

FIG. 4 shows the flowchart of the implementation of testing the image classification model.

DETAILED DESCRIPTION OF THE INVENTION

Figure 1:
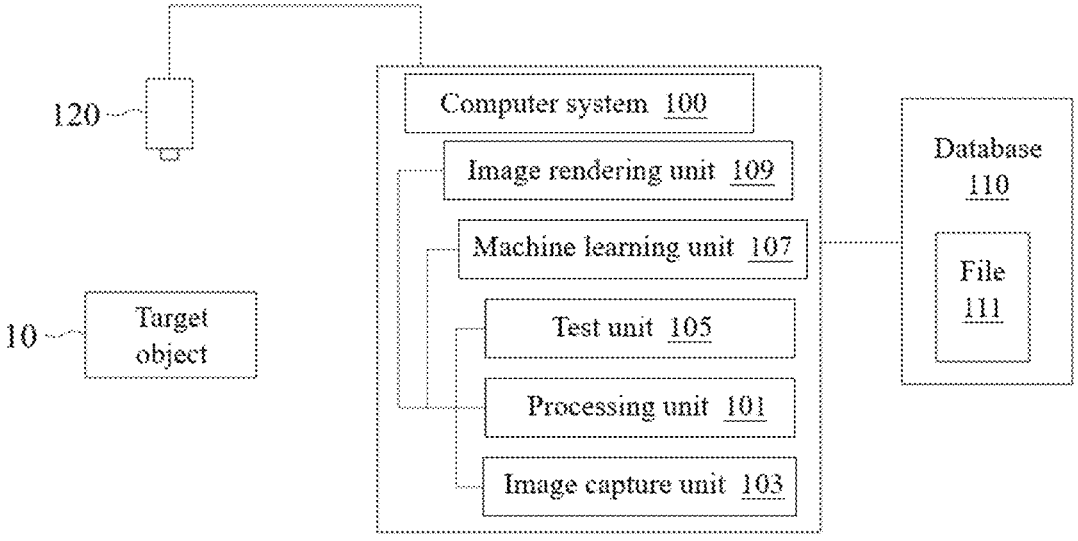
FIG. 1 shows the system architecture of the embodiment example of the learning system.

The following are specific embodiments to illustrate the implementation methods of the present invention. Those skilled in the art can understand the advantages and effects of the present invention from the content disclosed in this specification. The present invention can be implemented or applied through other specific embodiments, and the details in this specification can also be modified and modified based on different viewpoints and applications without departing from the concept of the present invention. In addition, the accompanying drawings of the present invention are only a simple schematic description and are not based on actual dimensions, as previously stated. The following implementation methods will further elaborate on the relevant technical content of the present invention, but the disclosed content is not intended to limit the scope of protection of the present invention.

It should be understood that although terms such as "first," "second," and "third" may be used in this article to describe various components or signals, these components or signals should not be limited by these terms. These terms are mainly used to distinguish one component from another, or a signal from another. In addition, the term "or" used in this article should include any or more combinations of related listed projects depending on the actual situation.

According to the embodiment example, the proposed learning system is implemented in a computer system, in which the training set of plural and diversified synthetic images is stored in a database, and the machine learning method for vectorized three-dimensional models is executed by a processor.

The proposed learning system first acquires the vectorized three-dimensional model of a target object, converts it to a specific file format, then uses it to render synthetic images. These synthetic images are further augmented to a sufficient volume and variety for the intended artificial intelligence model training.

In the embodiment example, the computer system is composed of the following functional units: Image capture unit that acquires the vectorized three-dimensional model of a target object. Image rendering unit that further converted and processed the vectorized three-dimensional models to automatically generate a large volume and variety of synthetic, two-dimensional images for model training and testing. Machine learning unit that utilizes ensemble algorithms to analyze synthetic images to train highly accurate and robust artificial intelligence models for object recognition.

Test unit that tests and validates the performance of the artificial intelligence models against testing datasets or real-world target objects.

Preferably, the said vectorized three-dimensional model includes engineering design drawings that obtained from computer-aided design (CAD) software, or stereoscopic scan files form stereoscopic scans of target objects from optical devices such as three-dimensional camera, but do not preclude other sources such as reconstruction from multimodal signals or sensor data.

Each vectorized three-dimensional model shall contain detailed representation of key components or features of the target object. When obtained from a stereoscopic scan, it is constructed by a computer system with an automated program controlling a camera, to capture images of these components and features of the target object at various environmental lighting conditions, distances, poses, and/or angles. It should be noted that such scans can also be performed on scale models or replicas of the target objects.

Furthermore, combinations of diverse environmental lighting conditions, surface materials, additional marks or objects, and backgrounds can be applied during the rendering and augmentation process to create synthetic images of different styles of the target object, such as polished surface under the sun or rusted condition in a dark room, to simulate the variations of real-world settings.

Furthermore, a large volume of the synthetic images of various states—combinations of at least one of the following parameters: distances, poses, angels, material, lighting, and backgrounds—are generated through the real image of the target object, properly mixed and divided into training and testing datasets with a proportion.

After that, an ensemble of machine learning algorithms is used to analyze and learn from the training dataset to build artificial intelligence models for object recognition under variations of real-world settings.

The types of artificial intelligence models for object recognition may include but are unlimited to, image classification, object detection, and image segmentation. Their performances are validated on testing datasets and real images of the target object. If the accuracy of the artificial intelligence model does not meet the desired range, more synthetic images can be rendered to enrich the training dataset by simulating the real-world settings where the errors are more likely to occur.

The invention proposes a machine-learning method and learning system thereof for image-related artificial intelligence using vectorized three-dimensional models. The technical concept is to render synthetic images of various states (e.g., background, lighting, posture, angle, and style) of the target objects using their vectorized three-dimensional models, to generate training and testing datasets for special-purpose, artificial intelligence model training. The vectorized three-dimensional models can be obtained from various sources of digital representation of the target objects, such as engineering design drawings, stereoscopic scan files, or other sources such as reconstruction from multimodal signals or sensor data.

In some embodiments, the sources of digital representation of the target objects include engineering design drawings or stereoscopic scan files. They are first converted to vectorized three-dimensional models in specific file formats (.obj file for example) for synthetic image rendering. Various synthetic images of target objects in different states can be generated in large quantities through automated scripts. Through the subsequent image augmentation process, various backgrounds or objects can be further added to enrich the training dataset. It should be noted that the diverse synthetic images can include different materials, lighting conditions, and optical lens parameters to simulate variations of real-world settings.

In some embodiments, engineering design drawings from computer-aided design (CAD) software, such as photomask design schematics in semiconductor manufacturing, are used for the vectorized three-dimensional models of the target objects. The engineering design drawings are first converted to vectorized three-dimensional models to render synthetic images of photomasks with artificial irregularities and defects added. Machine learning algorithms can be trained on these images, learn their features, and generate artificial intelligence models for wear-and-tear prediction or defect detection for photomasks before they are put in service in the production line.

In some embodiments, engineering design drawings can also include textile fabric design CAD files and their corresponding texture-related information (e.g., normal map) and physical properties (e.g., strength, elasticity, drape). The fabric design CAD files are converted to vectorized three-dimensional models, then used to render synthetic fabric images under various lighting conditions to train a fabric classification model. This artificial intelligence model can recognize fabric type and predict their texture and physical properties from a swatch of fabric image, reducing the cost of fabric digitization for applications such as digital garment design, ultrarealistic 3D computer games or animations.

In some embodiments, stereoscopic scan files are used as the source of digital representation of the target objects, such as automobile parts. They are generated by scanning target objects (or realistic scale models or replicas thereof) with a three-dimensional camera. Similarly, they are converted to vectorized three-dimensional models for synthetic image rendering. Then machine learning algorithms can be used to train on the synthetic images to build artificial intelligence models, such as part classifier to help automobile junkyards recycle serviceable parts for remanufacturing.

According to one of the embodiment examples of the learning system, a computer system is implemented to utilize vectorized three-dimensional model from engineering design drawings or stereoscopic scan files to render synthetic images. The system architecture of the learning system can be referred to in the embodiment example shown in FIG. 1.

According to the system architecture shown in FIG. 1, the main component of the learning system is computer system 100. Computer system 100 can be implemented with a processor, memory, peripheral hardware, and related software. According to the functions of the learning system, multiple functional modules are implemented through software paired with hardware in the computer system 100, which comprises the processing unit 101 that performs data processing, as well as the related circuits and software modules connected to the processing unit 101, such as the image capture unit 103, testing unit 105, machine learning unit 107, and image rendering unit 109.

Besides computer system 100, the learning system also includes computer system 100, database 110, and camera 120. During the operation of the embodiment example, control commands are transmitted through computer system 100 to camera 120 to capture images of target object 10. Specifically, camera 120 can preferably be a three-dimensional camera, which obtains a stereoscopic scan files of target object 10. After acquiring the stereoscopic scan files through image capture unit 103, the processing unit 101 calculates and reconstructs a vectorized three-dimensional model using the stereoscopic scan files. It should be mentioned that the optical scanning technology achieved through camera 120 is mainly based on structured light technology, time of flight (ToF), or a method of three-dimensional image ranging to perform optical scanning on target 10. In other embodiments, camera 120 can be substituted by computer graphics technology, such as computer-aid design (CAD) software that generates engineering design drawings of target object 10 (e.g., car engine or photomask design schematic), or any apparatuses or software that can generate digital representation of target object 10, to be further converted to vectorized three-dimensional models to render synthetic images for artificial intelligence model training.

Figure 2:
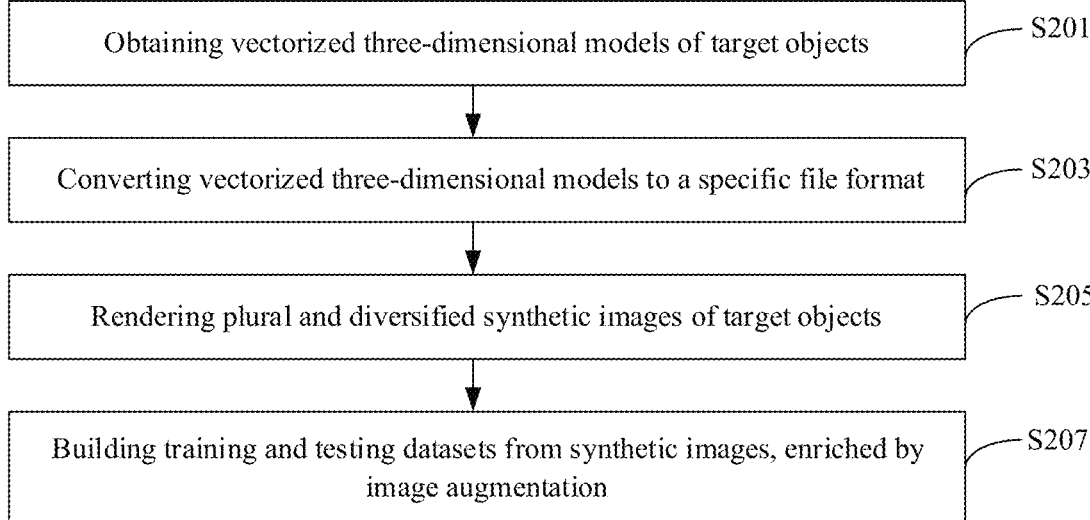
FIG. 2 shows the flowchart of an embodiment example of rendering plural and diversified synthetic images using the vectorized three-dimensional model.

After the above vectorized three-dimensional models specifically the engineering design drawings or stereoscopic scan files are obtained, plural and variety of synthetic images can be rendered by following the flowchart in the embodiment example in FIG. 2.

In the embodiment example in FIG. 2, computer system 100 obtains vectorized three-dimensional models from unit 103. According to the embodiment, images of a target object (and its variations) in different distances, poses, and angles can be obtained from optical device in camera 120, and then reconstructed as a vectorized three-dimensional model (step S201). The vectorized three-dimensional model is then converted into a specific file format that can be used to render synthetic images (step S203). Through image rendering unit 109 (such as a rendering software), plural and diverse synthetic images of different states of the target objects are generated to simulate variations of real-world settings (step S205). Using these synthetic images, processing unit 101 further applies image augmentation algorithms to expand the volume and variations of synthetic images to enrich the training and testing datasets (step S207). These datasets are temporarily stored in database 110, with the vectorized three-dimensional models stored as file 111 in the figure.

Corresponding to the flowchart in FIG. 2, the detailed process to generate training and testing datasets using vectorized three-dimensional models can be referred to in the embodiment example in FIG. 3.

In the embodiment example, images of multiple classes of a specific target object (e.g., variations of an automobile engine) are obtained by the image capture unit 103 in the form of engineering design drawings from computer-aid design (CAD) software, or stereoscopic scans from a three-dimensional camera controlled by an automatic program to capture images at different poses, styles, and/or angles of the various classes of the target object, which are converted to vectorized three-dimensional models (step S301). In this step, stereoscopic scan files are obtained from optical devices such as three-dimensional cameras, but do not preclude other sources such as reconstruction from multimodal signals or sensor data. It should be noted that such scans can also be performed on scale models or replicas of the target objects.

When vectorized three-dimensional models constructed from engineering design drawings or stereoscopic scan files are obtained by the learning system, images of multiple states (e.g., poses, styles, angles) for each target object class are generated from them. Images of each target object class at different poses, such as front, back, left, right, up, down, or other orientations, are obtained (step S303); Similarly, images of each target object class with different styles, such as varying environmental lighting conditions or surface materials, are also obtained (step S305), such as polished surface under the sun or rusted condition in a dark room, to simulate the variations of real-world settings; In this step, more images can also be added by varying the angle between the camera lens and the center of the target object, and synchronously capture images of various components of the target object (step S307).

After images of each target object class in different states are obtained, one or a few styles can be selected based on their fitness with the use scenarios for rendering through a software program, including a combination of different surface materials and lighting conditions (step S309). In this step, the combination includes at least one of the following parameters: distances, poses, angels, material, lighting, and backgrounds. The datasets used for training and testing artificial intelligence models are generated by the image rendering unit 109.

In accordance with the selected styles, multiple synthetic images with different poses are generated for each style (step S311), and multiple synthetic images with different angles are also generated for each style and pose combination (step S313). Then, they can be split into appropriate training and testing datasets using a specific proportion, such as 70/30 or 80/20 (step S315).

After the training dataset is obtained, the learning system can utilize the machine learning unit 107 in the computer system as shown in FIG. 1 to learn from plural and diversified images, by extracting features and establishing correlations thereof under different styles, poses, and angles, to construct an object classification model. It should be noted that other types of object recognition models, such as object detection or image segmentation, can also be obtained by deploying corresponding algorithms in machine learning unit 107.

Besides the rendered testing dataset (from step 315), the learning system can also use real images of target objects for additional testing in real-world settings, as shown in the flowchart of the embodiment example in FIG. 4. This additional testing dataset can be obtained from each of the target object classes by controlling the camera to obtain real images as shown in FIG. 1 with a certain combination of poses, styles, and angles (step S401).

As such, the artificial intelligence models trained from machine learning unit 107 can be further tested by test unit 105 of the learning system, by using the testing dataset of real images (step S403). The performance of the artificial intelligence model is calculated (step S405), and the learning system can optimize its performance by reiterating the machine learning process with additional training dataset rendered until the desired performance is reached. If the accuracy of the artificial intelligence model does not meet the desired range, more synthetic images can be rendered to enrich the training dataset by simulating the real-world settings where the errors are more likely to occur.

In the embodiment example of automobile part classification, each part of the car is scanned by a three-dimensional camera. Since some parts are heavy (e.g., engine, transmission), they can only be scanned in fixed poses. To obtain stereoscopic scan files, we can move the camera up, down, left, and right for a wider range of degrees (such as 10 degrees), then gradually adjust it back to the original position with a small interval (such as every 0.5 degree) each time and take a photographic scan for each adjustment. Once the stereoscopic scan files for each part is obtained and converted to a vectorized three-dimensional model file, plural and diversified synthetic images of different poses, styles, and angles can be rendered and split into training and testing datasets. Then machine learning algorithms can be used to train an artificial intelligence classifier on the synthetic images to help automobile junkyards recycle serviceable parts for remanufacturing.

Note that for artificial intelligence models to perform well in real life, the selection of styles when rendering synthetic images is crucial, as they need to sufficiently simulate variations of real-world settings. In our embodiment example, ten styles are used, each of which includes six different materials (e.g., various types and conditions of aluminum alloys) and lighting sources (e.g., sunlight, lightbulbs), as well as three backgrounds (e.g., junkyards, warehouses), to help the artificial intelligence classifier correctly recognizes different automobile parts in real life.

As an embodiment of the artificial intelligence classifier for automobile parts, a smartphone app is utilized to take walk-around videos on the target objects, in addition to photos on all sides, until the target objects are identified by the artificial intelligence classifier. These real-world videos and photos are then collected to enrich the testing datasets, so that the performance of the artificial intelligence models can be objectively evaluated and enhanced through continuous, reinforced learning.

Application Scenario 1: Smart Textile Scenario

Another embodiment example is in textile fabric digitization. As the growing demand for digital fabrics is driven by applications such as ultra realistic animation, digital garment design, and 3D computer games, the current method for fabric digitization is cumbersome and resource intensive. It usually requires meticulously prepared physical specimens, scanned in a lightbox to obtain the texture-related properties (e.g., roughness and diffusion), and measured by special equipment for its physical properties (e.g., tensile strength). Alternatively, an animator with knowledge in textile can manually design weaving patterns for the fabric and set corresponding physical parameters, but it requires time-consuming labor and special training.

This invention overcomes these limitations by introducing an artificial intelligence method for fabric classification connected to a database of fabric properties. In the embodiment example, numerous textile fabric design CAD files, with their corresponding fabric layer information (e.g., material composition, yarn size, yarn density, weaving method, weaving parameters), texture-related information (e.g., base, normal, roughness, metalness, alpha, and placement maps) and physical properties (e.g., strength, elasticity, drape) are stored in a database. The fabric design CAD files are converted to vectorized three-dimensional models, then used to render synthetic fabric images under various lighting conditions to train a fabric classification model.

Figure 5:
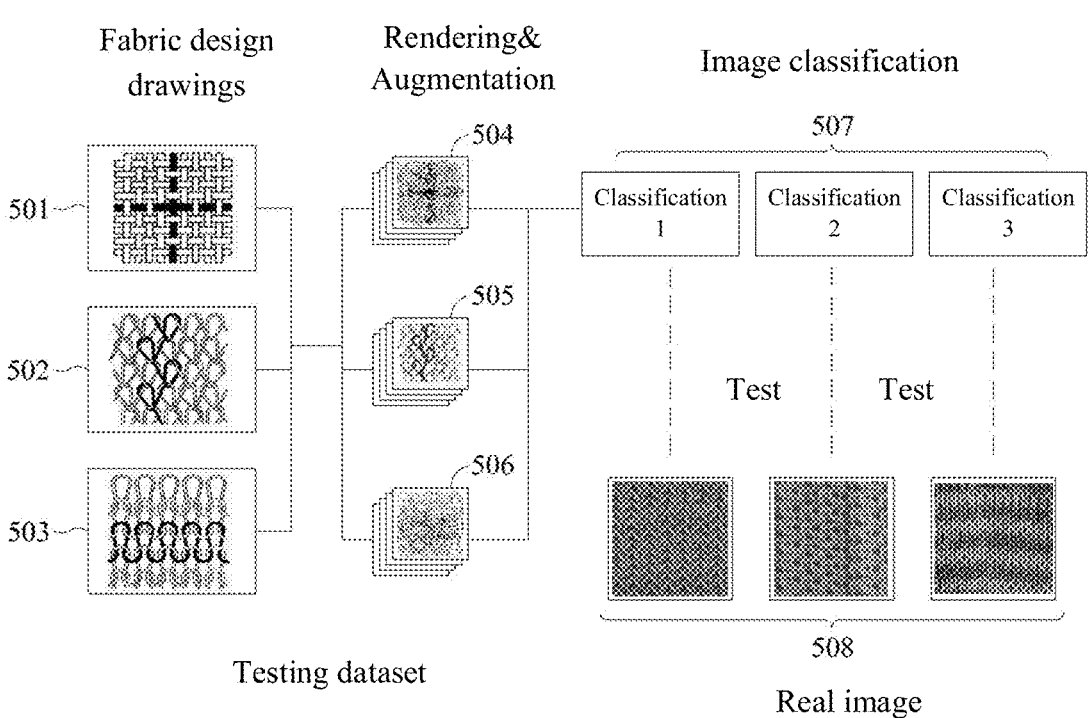
FIG. 5 shows a schematic diagram of an embodiment example of training an image classification model using the vectorized three-dimensional models of target objects.

FIG. 5 shows a schematic diagram of an embodiment example in smart textile scenario of training an image classification model using the vectorized three-dimensional models of target objects.

FIG. 5 illustrates the approach by first obtaining fabric design drawings 501, 502, and 503. After converting them to vectorized three-dimensional models, plural and diversified synthetic images are rendered with different styles, angles, and/or poses for each fabric design drawing 501, 502, and 503. Through data augmentation, more data is generated to obtain synthetic images 504, 505, and 506. The rendered images can be split into training and testing datasets at a specific proportion, used to train an artificial intelligence model for fabric classification. This artificial intelligence model can recognize fabric type and predict their layer, texture and physical properties from a swatch of fabric image by retrieving relevant information from the fabric property database. This streamlined approach empowers garment designers, animators, and game developers to easily integrate realistic fabrics into their projects without the need for specialized expertise or laborious physical characterization.

Application Scenario 2: Smart City Scenario

Another embodiment example is in vehicle recognition for smart cities. Identifying the vehicle make, model, and year from surveillance images can provide granular data for traffic control, public safety, and emission monitoring without privacy concerns from using license plate recognition.

Figure 6:
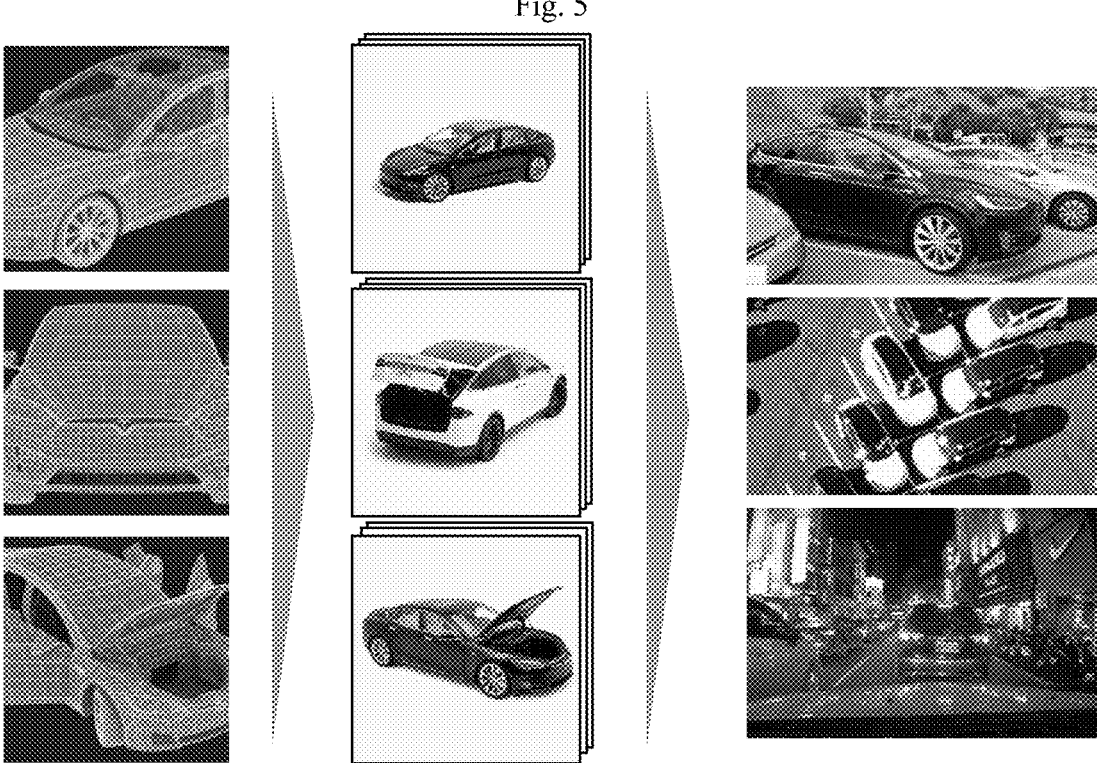
FIG. 6 shows a schematic diagram of an embodiment example of using the vectorized three-dimensional models of vehicles to train an object recognition model.

FIG. 6 demonstrates a workflow using this invention to train a vehicle classification model converting scale models (1:18 scale) of common cars on the road to vectorized three-dimensional models (.obj files). The learning system generates a large volume of training dataset through synthetic image rendering. In order to emulate the real-world settings, various perspectives, including bird's-eye view from drones, high-angle view from roadside monitors, and eye-level view from driver recorders, are used in synthetic image rendering and augmentation.

Ensuring accurate real-world vehicle recognition also requires careful selection of rendering styles. For instance, this example utilizes ten styles: six with varying materials and lighting, and four for abstract painting styles for blurry weather conditions. This diversity helps the vehicle recognition artificial intelligence identify global features across different image styles. Additionally, unlike general-purpose object detection models that categorize all cars as one class, our invention provides higher data granularity, capable of recognizing specific car models included in the training dataset. This will be especially valuable for law enforcement: if a car accident witness reports a specific car model (e.g., Toyota Altis) but cannot recall the license plate number, our artificial intelligence model can perform large-scale inference across all recorded video footage. This eliminates the need for manual searches and expedites locating the target vehicle based solely on the surveillance images.

Application Scenario 3: Smart Museum Scenario

Figure 7:
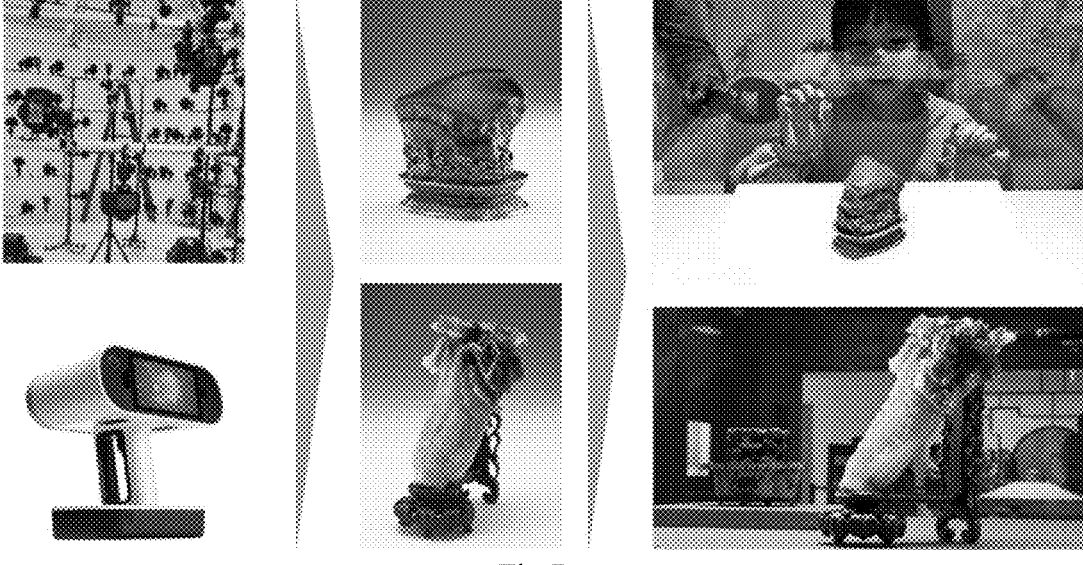
FIG. 7 shows a schematic diagram of an embodiment example of using the vectorized three-dimensional models of cultural relics to train an object recognition model.

Another embodiment example is in cultural relic identification for smart museums to provide immersive and educational visitor experience. FIG. 7 demonstrates the process using our invention to train an artifact recognition model. Various stereoscopic scan files of the target artifacts are converted into vectorized three-dimensional models (.obj files) first, then the learning system uses them to render synthetic images of the artifacts from diverse angles, mimicking different viewing perspectives inside the museum.

Ensuring accurate real-world identification requires meticulous selection of the rendering styles. For instance, this example utilizes ten styles: six with varying materials and lighting, and four with various filters to emulate the museum settings. This diversity helps the artifact recognition artificial intelligence identify key features across different image styles. Moreover, unlike traditional methods, our invention leverages rendered images to create vast training datasets efficiently, significantly reducing manual effort.

This trained artifact identification artificial intelligence can be integrated into museum app systems, fostering interactive and immersive visitor experiences. Visitors can identify artifacts from afar or remotely using the app, and even receive insights into details only visible from specific angles (e.g., locusts on jade cabbage).

In summary, the present invention discloses a machine learning method and learning system on vectorized three-dimensional model, which can be constructed from engineering design drawings or stereoscopic scan files of the target objects. The vectorized three-dimensional model is used to render plural and diversified synthetic images for training and testing datasets, reducing the cost and labor to collect real images and label them.

It is crucial to understand that the embodiments presented herein are only preferred examples, and do not limit the scope of the present invention. Any technical modifications equivalent to the disclosed concept and design fall within the purview of the patent application.

What is claimed is:

1. A machine-learning method, comprising:
scanning a target object to obtain stereoscopic scan files of the target object by a three-dimensional camera;
calculating and constructing a vectorized three-dimensional model of the target object from the stereoscopic scan files, wherein the vectorized three-dimensional model is constructed by a computer system with an automated program controlling the three-dimensional camera to capture images of components of the target object at various distances, poses, and angles, so as that the vectorized three-dimensional model of the target object contain detailed representations of the components at various poses relative to the target object;
converting the vectorized three-dimensional model to a specific file format that can be used for rendering and using a rendering program to generate plural and diversified first synthetic images;
applying image augmentation algorithms on the first synthetic images to generate plural and diversified second synthetic images; and
forming a training dataset and a testing dataset according to the first and the second synthetic images.

2. The machine learning method of claim 1, wherein, while said constructing the vectorized three-dimensional model of the target object, different environmental light sources are introduced to model the surface materials of each component of the target object, in order to render and produce the first synthetic images with different styles.

3. The machine learning method of claim 1, wherein, after said capturing images of components of the target object at various distances, poses, and angles, one or a few of multiple styles are selected to be applied to the rendering program to generate the first synthetic images, wherein the style is a combination of diverse environmental lighting conditions and surface materials.

4. The machine learning method as described in any one of claims 1, 2 and 3, wherein, the first and the second synthetic images are divided into the training and the testing datasets with a proportion.

5. The machine learning method of claim 4, wherein an ensemble of machine learning algorithms is used to learn from the training dataset to build an object recognition model.

6. The machine learning method of claim 5, wherein a type of the object recognition model includes at least one of following: image classification, object detection, and image segmentation.

7. The machine learning method of claim 6, wherein the object recognition model is used to process the testing dataset or real images of the target object in order to evaluate the object recognition accuracy.

8. A learning system, comprising:
a three-dimensional camera; and
a computer system, wherein including a database, and a processor, which is used to execute a machine learning method on a vectorized three-dimensional model, wherein the machine learning method comprising:

scanning a target object to obtain stereoscopic scan files of the target object by the three-dimensional camera;

calculating and constructing the vectorized three-dimensional model of the target object from the stereoscopic scan files, wherein the vectorized three-dimensional model is constructed by the computer system with an automated program controlling the three-dimensional camera to capture images of components of the target object at various distances, poses, and angles, so as that the vectorized three-dimensional model of the target object contain detailed representations of the components at various poses relative to the target object;

converting the vectorized three-dimensional model to a specific file format that can be used for rendering and using a rendering program to render plural and diversified first synthetic images;

applying image augmentation algorithms on the first synthetic images to generate plural and diversified second synthetic images; and forming the training dataset and a testing dataset according to the first and the second synthetic images stored in the database.

9. The system of claim 8, wherein, the computer system is composed of:

image capture unit that acquires the vectorized three-dimensional model of the target object;

image rendering unit that generate a large volume of the first synthetic images of various states based on combinations of styles, poses, and angles through the vectorized three-dimensional model of the target object;

a processing unit that applies image augmentation algorithms on the first synthetic images to generate the plural and diversified second synthetic images;

machine learning unit that to learn from the training dataset to build an object recognition model under variations of real-world settings; and test unit that tests and validates performance of the object recognition model against the testing dataset or real-world target objects.

* * * * *